(12) United States Patent
Abenaim

(10) Patent No.: US 6,229,311 B1
(45) Date of Patent: May 8, 2001

(54) MAGNETIC RESONANCE IMAGING SYSTEM INSTALLATION

(75) Inventor: Daniel Abenaim, Lynnfield, MA (US)

(73) Assignee: Analogic Corporation, Peabody, MA (US)

( * ) Notice: Subject to any disclaimer, the term of this patent is extended or adjusted under 35 U.S.C. 154(b) by 0 days.

(21) Appl. No.: 09/244,666

(22) Filed: Feb. 4, 1999

Related U.S. Application Data

(60) Provisional application No. 60/073,829, filed on Feb. 5, 1998.

(51) Int. Cl.[7] ............................................. G01V 3/00
(52) U.S. Cl. ................................... 324/322; 324/318
(58) Field of Search .................... 324/318, 319, 324/320, 321, 307, 309, 300, 322; 600/421, 422

(56) References Cited

U.S. PATENT DOCUMENTS

| Re. 33,505 | 12/1990 | Vinegar et al. ..................... 324/320 |
| 4,003,426 | 1/1977 | Best et al. ............................ 165/53 |
| 4,585,994 | 4/1986 | Ewing ................................. 324/318 |
| 4,613,820 | 9/1986 | Edelstein et al. ................... 324/318 |
| 4,646,046 | 2/1987 | Vavrek et al. ...................... 335/301 |
| 5,184,074 | 2/1993 | Kaufman et al. ................... 324/309 |
| 5,239,265 | 8/1993 | Sugahara ............................ 324/309 |
| 5,335,173 | 8/1994 | Sasahara ........................ 364/413.22 |
| 5,398,686 | 3/1995 | Inoue et al. ...................... 128/653.2 |
| 5,432,544 | 7/1995 | Ziarati .................................. 348/61 |
| 5,464,014 | * 11/1995 | Sugahara ......................... 128/653.2 |
| 5,735,278 | * 4/1998 | Hoult et al. ..................... 128/653.2 |

* cited by examiner

Primary Examiner—Louis Arana
(74) Attorney, Agent, or Firm—McDermott, Will & Emery

(57) ABSTRACT

A magnetic resonance imaging (MRI) system includes an integrated processing and control system which eliminates many of the redundant functions in prior art systems. The MRI system is installed in a suite that consists essentially of a shielded room and a control room. The MRI scanner and patient table are located in the shielded room and the integrated processing and control system is located in the control room. Components of integrated processing and control system can be mounted to a wall, common to the shielded room and the control room, whereby at least the portion of the wall to which the components are mounted can function as a heat sink for the components of the integrated processing and control system generating heat. The heat sink has an effective thermal mass at least one order of magnitude greater than the combined thermal mass of the components attached to the wall. The thermal mass can be a passive system or an active system. Each component that requires a connection with equipment within the shielded room (such as the MRI scanner) includes a connector on the back side of the component that is aligned with and can extend into an opening in the wall in order to facilitate a direct connection with the external equipment eliminating the need for a separate penetration panel and interfacing filters. By so co-locating the components, the integrated processing and control system may include at least one common power bus or at least one common data/control bus that services many of the components.

12 Claims, 4 Drawing Sheets

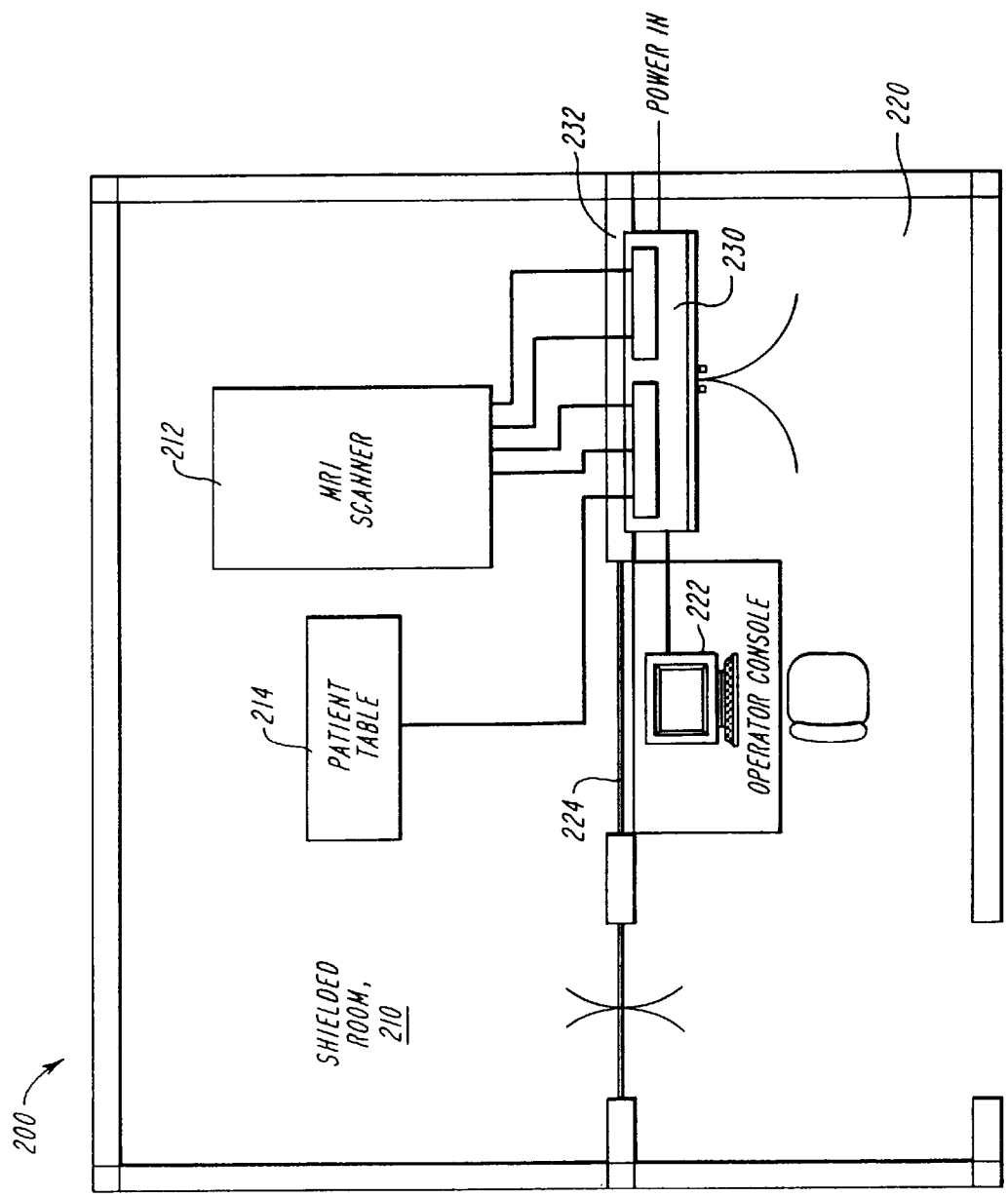

MAGNETIC RESONANCE IMAGING SYSTEM INSTALLATION

CROSS-REFERENCE TO RELATED APPLICATIONS

This application is based upon provisional application filed on Feb. 5, 1998 and accorded Ser. No. 60/073,829.

STATEMENT REGARDING FEDERALLY SPONSORED RESEARCH

Not Applicable

REFERENCE TO MICROFICHE APPENDIX

Not Applicable

BACKGROUND OF THE INVENTION

This invention relates to magnetic resonance imaging (MRI) systems and, more particularly, to the arrangement, interconnection and configuration of MRI system components which provides an improved, integrated and simplified system.

The following patent references have been considered: U.S. Pat. No. 4,003,426 (Best et al.); U.S. Pat. No. 4,585,994 (Ewing); U.S. Pat. No. 4,613,820 (Edelstein et al.); U.S. Pat. No. 4,646,046 (Vavrek et al.); U.S. Pat. No. 5,184,074 (Kaufman et al.); U.S. Pat. No. 5,239,265 (Sugahara); U.S. Pat. No. 5,335,173 (Sasahara); U.S. Pat. No. 5,398,686 (Inoue et al.); U.S. Pat. No. 5,432,544 (Ziarati); and U.S. Pat. No. Re 33505 (Vinegar et al.).

MRI systems are well known imaging systems used in the healthcare field for the diagnosis and treatment of patients. MRI systems are installed in hospitals and other healthcare facilities in expensive, custom tailored suites. FIG. 1 shows a typical arrangement and configuration of an MRI system. The typical MRI system includes many subsystems which are developed independently and packaged separately in conventional relay racks or cabinets. Each rack or cabinet is interconnected with the other subsystems by a large number of expensive cables. These subsystems can include RF power subsystems, gradient power subsystems, spectrometer subsystems, power supply and power distribution subsystems, cooling subsystems and auxiliary systems such as motor controllers, temperature sensing and control systems, and shim power subsystems.

Typically, the MRI system is installed in a suite which includes a shielded room, an operator control room and an equipment room. The walls of the shielded room are specifically designed to contain certain electromagnetic fields and radiation generated by the equipment located therein, and to exclude interfering signals. The operator console is located in the operator control room, adjacent to the shielded room, and can include a window to enable the operator to observe the MRI scanner in operation. The equipment room is adjacent to the shielded room and the operator control room and houses the plurality of interconnected subsystems that perform the MRI system functions. The equipment room also includes a power distribution panel for supplying electricity to the each of the subsystems. A cooling system is also needed to cool all the subsystem equipment in the equipment room since the equipment usually generates a substantial amount of heat which if left unattended could interfere with the performance of the equipment.

The prior art MRI systems are complex due to the number of separate pieces of equipment and the number of interconnections needed to connect the data, control and power signals among the various cabinets, the MRI scanner, the patient table and the operator console. Typically, the interconnections are accomplished using expensive cables which are shielded to protect the signals from noise. The system is further complicated because many of the cables must penetrate walls in order to interconnect subsystems that are located in different rooms. For example, the MRI scanner, located in the shielded room, is connected to the Gradient Power Controller, RF Assembly and Spectrometer equipment housed in cabinets that are located in the equipment room. In order to facilitate the connection between the shielded room and the equipment room, a penetration panel is provided to facilitate the connection through a shielded wall, while maintaining the shielded barrier between the two rooms. The use of a penetration panel increases the number of connectors, which reduces the reliability of the MRI system and makes the interconnections more susceptible to noise related errors. In addition, in order to facilitate noise rejection, many of the interconnections are provided with intermediate filters which increases the costs of the overall installation.

The prior art systems are wasteful and redundant because each of the subsystems is independently developed and includes its own power supply. Typically, the redundant power supplies and associated support electronics along with the extensive filtering components generate sufficient heat to require a separate cooling system.

Accordingly, it is an object of this invention to provide an improved installation for an MRI system.

It is another object of this invention to provide an improved installation for an MRI system in which the various subsystems are integrated onto a portion of the shielded room wall, combining penetrations and eliminating conventional electronic cabinets with separate filters.

It is a further object of this invention to provide an improved installation for an MRI system which includes an integrated system for controlling the MRI scanner and the scanning process as well for processing the data received which does not require a separate cooling arrangement for each subsystem.

It is yet another object of the present invention to provide an improved installation for an MRI system in which the various subsystems are integrated onto a physical assembly sharing a common data bus, control bus, and/or power bus to minimize cabling.

SUMMARY OF THE INVENTION

In accordance with one aspect of the invention an MRI system is installed into a suite made of essentially two adjacent rooms: the shielded room and the operator control room. The walls, floor and ceiling of the shielded room are shielded to prevent the escape of electromagnetic radiation. The MRI scanner and the patient table are located in the shielded room. The integrated processing and control system and the operator console are located in the operator control room. The integrated processing and control system is mounted to a wall, or a portion of a wall, that separates the shielded room from the operator control room and functions as a heat sink for the heat generating equipment that make up the integrated processing and control system. To this extent the effective thermal mass of the heat sink wall is at least one order of magnitude greater than the combined thermal mass of the heat generating equipment which is mounted on the heat sink wall. By providing a large heat sink for transferring heat, the need to have separate equipment and operator control rooms is eliminated, although providing two such rooms with a heat sink wall is well within the scope of the present invention. In one embodiment the wall is a passive heat sink, and in another embodiment the wall is an active heat sink wall.

In addition, the cables that interconnect the devices and systems in the shielded room with the different modules of the integrated processing and control system are connected directly to the appropriate modules via connectors mounted to the backside of the integrated processing and control system which penetrate the wall into the shielded room.

The integrated processing and control system is adapted to perform at least some, if not all, of the system functions normally associated with MRI systems. Preferably, the integrated processing and control system includes a system controller (such as a computer), an RF assembly including a transceiver and RF amplifier, a power supply, a Power Gradient Controller Assembly, a power filter module and a power distribution module. Additional or auxiliary equipment modules, such as motor controllers and sensors, temperature controllers and sensors and shim power supplies can also be included. Preferably, the integrated processing and control system includes at least one power bus for supplying power to each of the control system modules and at least one data/control bus in order to facilitate the transfer of data and control signals between equipment modules.

BRIEF DESCRIPTION OF THE DRAWINGS

The foregoing and other objects of this invention, the various features thereof, as well as the invention itself, may be more fully understood from the following description, when read together with the accompanying drawings in which:

FIG. 2 is a diagrammatic view of an embodiment of an MRI system designed in accordance with the present invention;

DETAILED DESCRIPTION OF THE PREFERRED EMBODIMENTS

Figure 1:
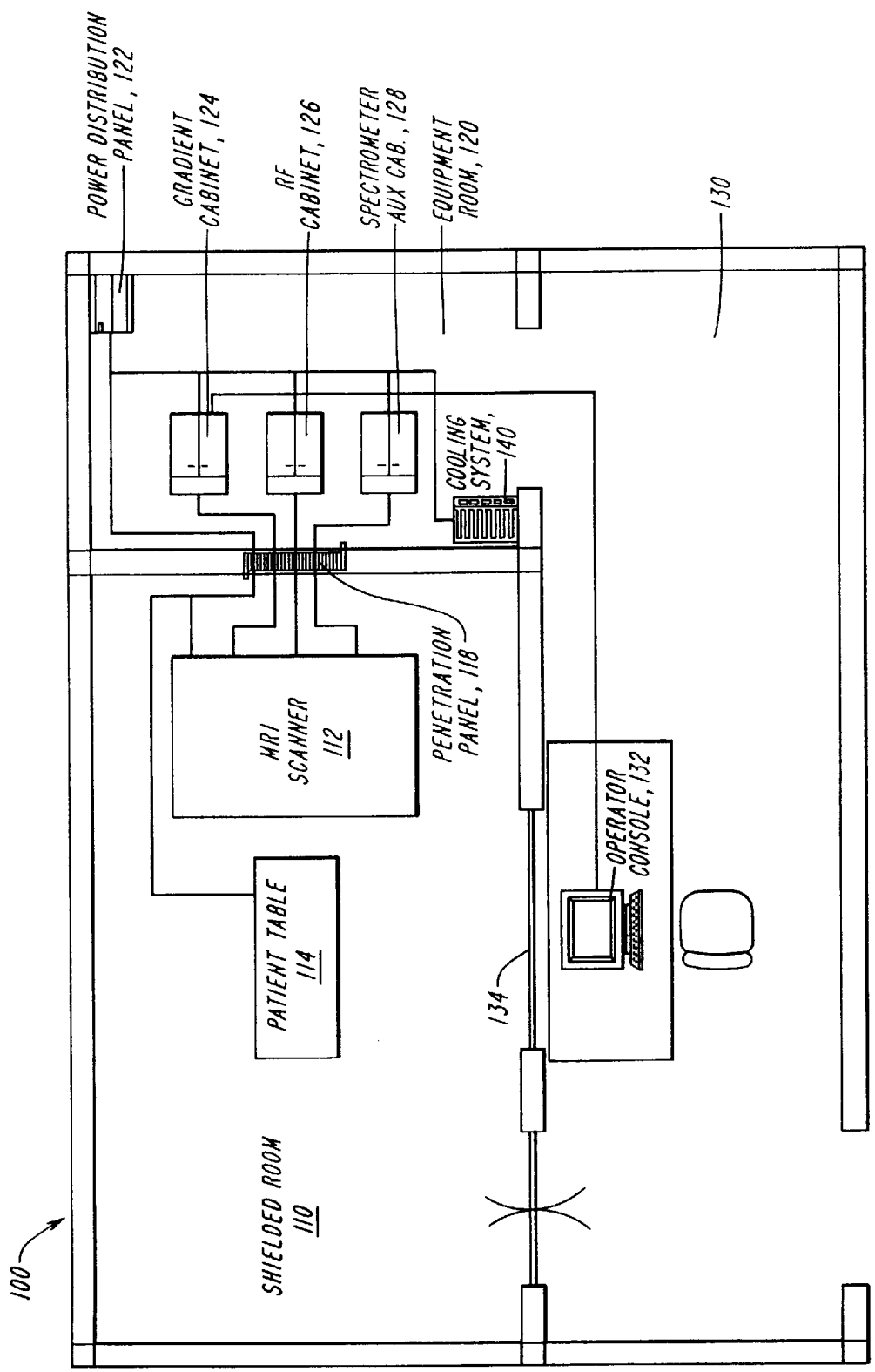
FIG. 1 is a diagrammatic view of a prior art MRI system.

FIG. 1 shows a schematic diagram of a typical prior art MRI system installation 100. The system installation 100 typically comprises a suite which includes three adjacent rooms: a shielded room 110, an equipment room 120 and an operator control room 130. The MRI scanner 112 and the patient table 114 are located in the shielded room 110 and the walls, door and windows of the shielded room are adapted to contain certain electromagnetic radiation generated therein. The power gradient controller 124, the RF assembly 126 and the spectrometer and auxiliary equipment 128 are housed in separate cabinets that are located in the equipment room 120. The power distribution panel 122 and the cooling outlet of an air conditioning (cooling) system, generally referred to at 140, are also located in the equipment room 120. The operator console 132 is located in the operator control room 130.

Each piece of equipment including the MRI scanner 112, the patient table 114, the power gradient controller 124, the RF assembly 126, the spectrometer 128 and the air conditioning system 140 is connected to the power distribution panel 122. Large and expensive data cables are used to interconnect the various pieces of equipment to each other. Each of the power gradient controller 124, the RF assembly 126, the spectrometer and the auxiliary equipment 128 are typically housed in conventional relay racks. Each relay rack often includes its own control system (e.g. a computer or micro-controller), a power supply and a cooling system (not shown). Custom input/output interface devices may also be needed to interconnect one type of rack with another.

FIG. 2 shows a schematic diagram of a preferred embodiment of an MRI system installation 200 designed in accordance with the present invention. The MRI system installation 200 comprises a suite, preferably consisting of two adjacent rooms: a shielded room 210 and an operator control room 220, although it is contemplated that less efficient installations can be designed with more than two rooms. The walls, doors and windows of the shielded room 210 are adapted to prevent certain electromagnetic radiation from leaking out. The MRI scanner 212 and patient table 214 are located in the shielded room 210. The operator console 222 and the integrated processing and control system 230 are located in the operator control room 220 which need not be completely enclosed. The operator console 222 and the integrated processing and control system 230 are located directly adjacent to the shielded room so that the operator control room 220 and shielded room 210 share a common wall 232.

Figure 4:
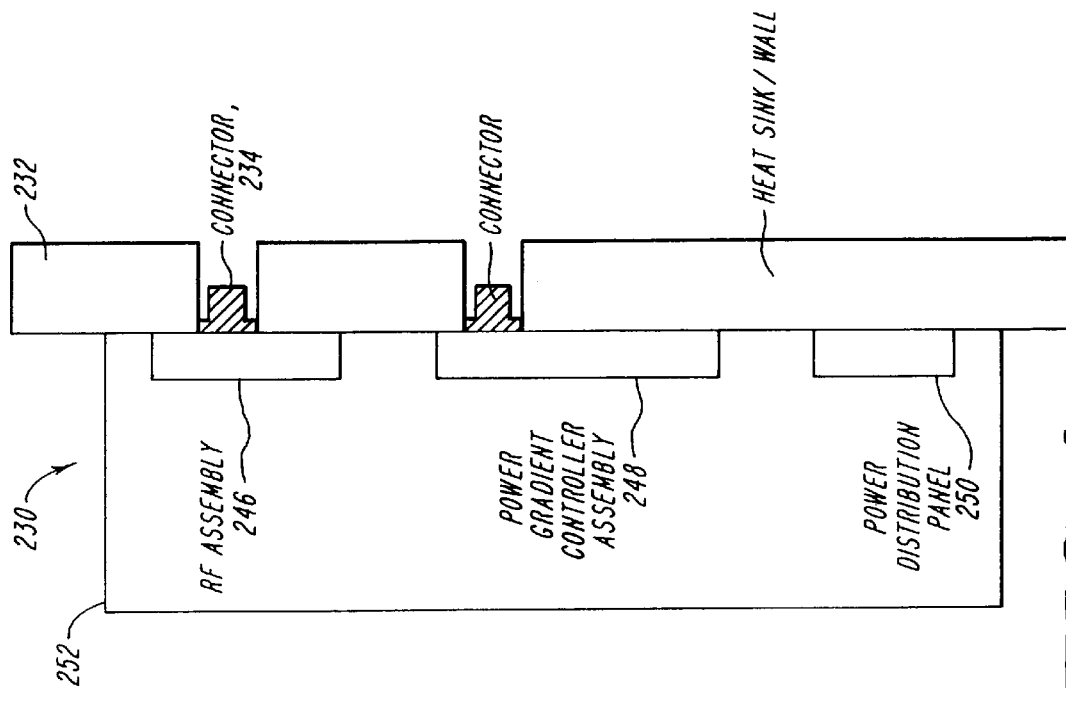
FIG. 4 is a diagrammatic side view of an embodiment of an integrated processing and control system in accordance with the present invention.
Figure 3:
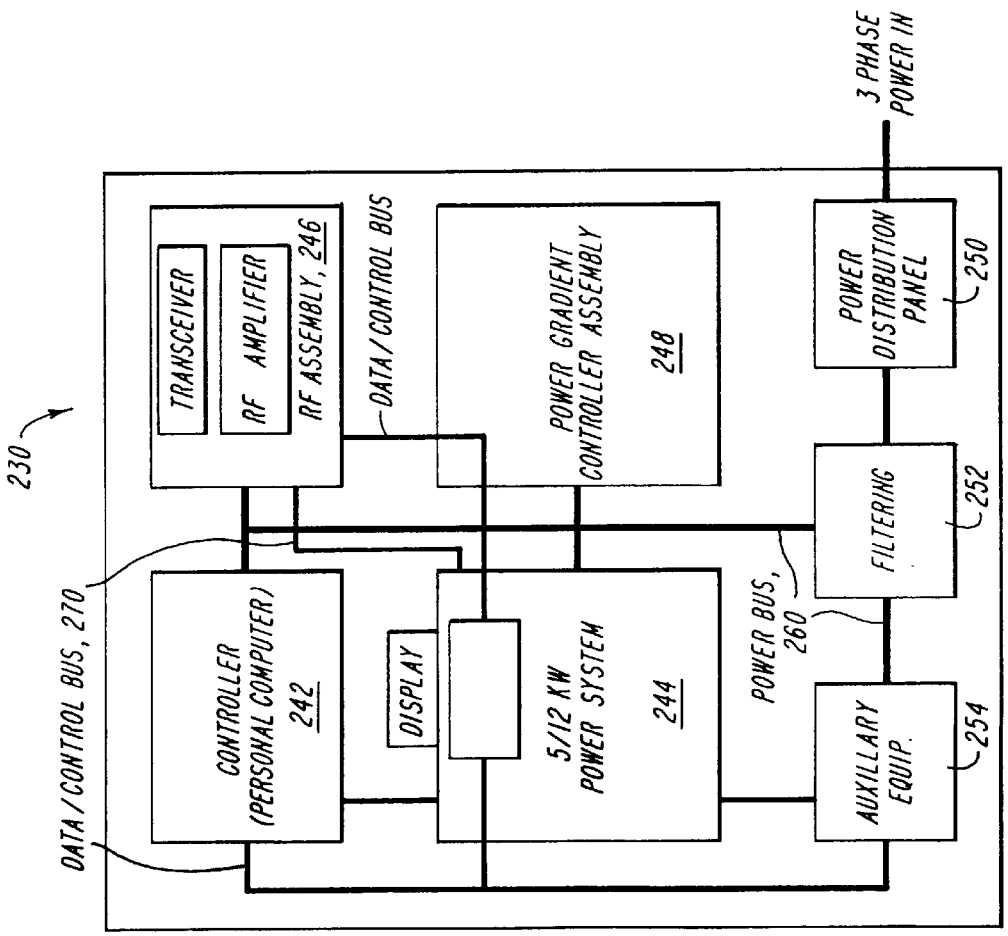
FIG. 3 is a diagrammatic plan view of an embodiment of an integrated processing and control system designed in accordance with the present invention.

FIGS. 3 and 4 show a preferred embodiment of the MRI system integrated processing and control system 230 which is preferably mounted to the outside of at least a portion of one of the walls 232 common to the shielded room 210. As shown in FIG. 3, the integrated processing and control system 230 comprises a plurality of functional modules that are connected to at least one of a common power distribution bus 260 or a common data/control bus 270. The integrated processing and control system 230 can include a controller 242 (such as a mini-computer or a personal computer), an RF assembly 246 (such as may be used to transmit control information to and receive data from the MRI scanner), a power gradient controller assembly 248, a power system 244, auxiliary equipment 254 (such as motor controllers and sensor, temperature controllers and sensors and shim power supplies for adjusting the magnetic field in the MRI scanner). In addition, the integrated processing and control system 230 can include a power distribution panel 250 and a power filter 252 (for filtering the power distributed over the power bus). Preferably, the power distribution panel 250 receives 3 phase power input and produces a plurality of output power sources which distribute power over the power bus 260.

As shown in FIG. 4, preferably, all of those components which generate heat are mounted to the wall 232. At least a portion of the wall 232 to which the components are mounted acts as a heat sink for the module. Accordingly, the portion of the wall 232 which is constructed of a suitable material, and is of a size and thickness so as to provide a thermal conductive material having an effective thermal mass at least one order of magnitude larger than the thermal mass of the combined thermal mass of the components mounted to the wall 232.

Figure 5:
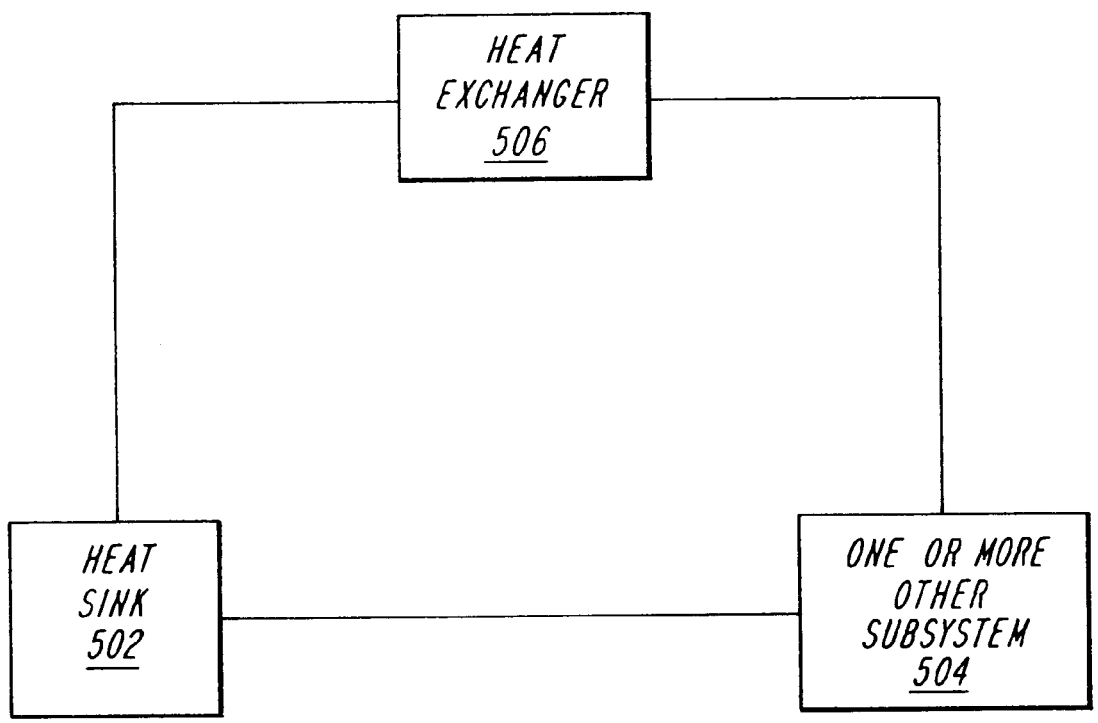
FIG. 5 is a block diagram of an alternative embodiment of the invention.

An alternative to the large thermal mass which passively absorbs the heat and thus cools the subsystems attached to the wall, would be to actively cool the wall, using a coolant either passed over or circulated through suitable conduits within the wall so as to transfer the heat from the wall to the fluid. As shown in FIG. 5, for example, the fluid preferably is then suitably transferred (as through an insulated pipe or pipes) from the heat sink wall, indicated at 502, and may be shared with one or more other subsystems 504, such as the magnet and/or coils, so that the actively cooled wall may be of a smaller mass and yet provides a larger effective thermal mass because the heat can be dissipated at a faster rate. After absorbing the heat, the coolant can be transferred to a heat exchange device 506 positioned remotely such that the absorbed heat can be dissipated remotely from the installation. Clearly the material and size of the panel can vary depending on the components used, and in particular the requirement that the thermal mass of the panel is much larger than the thermal mass of the components secured to the panel. A passive heat sink arrangement requires a larger mass, than one that is actively cooled. By using the present invention, in many applications, a separate air conditioning unit may not be needed.

In addition, the cable connections 234 that are used to connect the components, mounted on the portion of the wall 232, to the equipment in the shielded room are mounted to the back side of each component and can extend into a predefined opening in the wall 232 of the shielded room 210 specifically designed to receive the connector of the respective component. The cables that connect these components to the equipment in the shielded room 210 are connected directly the connectors 234 on the back side of each functional module without having a separate component, such as a penetration panel, in between. Because the components are directly connected to the equipment they support, the connection is more reliable and less susceptible to noise and eliminate the need for interfacing filters. In the preferred embodiment, the integrated processing and control system 230 can be covered with a cover panel 252 so as to form with the wall 232 a contained system approximately 4 feet wide by 6 feet tall and 8 inches thick. The cover panel may also be made of a thermally conductive material so as to conduct heat to the heat sink and therefore help insulate the remaining portion of the operator control room 220 (see FIG. 2) from the generated heat.

As one of ordinary skill will appreciate, the integrated processing and control system 230 can include more than one power bus and more than one data/control bus depending upon the requirements for the system. For example, alternating current power and direct current power can be provided as needed to different components. Furthermore, a high speed data bus can be provided such as to support high speed data acquisition systems in addition to the normal data/control bus. A person having ordinary skill will also appreciate that while the invention was described in connection with an MRI system, the invention can be applied to other medical imaging systems such as computed tomography (CT) systems and positron emission tomography systems as well.

The invention therefore has clear advantages over the prior art. While the patent by Best, U.S. Pat. No. 4,003,426, addresses a particular material construction for heat sink use, it does not address the integration of MRI system components into a shielded room wall. Unlike the systems described by Kaufman in U.S. Pat. No. 5,184,074 or Ziarati in U.S. Pat. No. 5,423,544, the separating wall of the MRI system installation of the present invention supports and heat sinks the components of the system. And unlike Sasahara U.S. Pat. No. 5,335,173, the apparatus described herein is deliberately arranged with elements co-located on the separating wall, allowing the use of common bus structures without needing extended, expensive wiring and filters.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. An installation for a medical imaging system comprising:
 a suite of at least two adjacent rooms, a shielded room and an operator control room;
 a medical imaging scanner; and
 a processing and control system;
 wherein the shielded room is sized to contain at least a medical imaging scanner for generating internal images of a patient, and the operator control room is sized so as to contain an integrated processing and control system arranged so as to control the operation of the scanner, wherein the shielded room and operator control room share a common wall, at least part of the wall (a) directly supports and is in thermal contact with the components of the processing and control system of the type that generate heat and (b) provides a heat sink for the components so as to conduct the heat from the components into the heat sink.

2. An installation according to claim 1, wherein the scanner is a MRI scanner.

3. An installation according to claim 1, wherein the medical imaging system includes an operator control station and control elements distributed in location among the scanner, the operator control station, and the heat sink wall.

4. An installation according to claim 1, wherein the effective thermal mass of the part of the wall supporting the components is at least one order of magnitude larger than the thermal mass of the supported components.

5. An installation according to claim 1, wherein connectors extend from the components into apertures formed in the wall so as to eliminate the need for a separate penetration panel.

6. An installation according to claim 1, wherein the components are connected to the scanner through the wall without the need for additional interfacing filters for reducing noise at the wall interface.

7. An installation according to claim 1, further including a cover constructed and arranged to cover the components mounted on said wall.

8. An installation according to claim 1, wherein the integrated processing and control system includes at least one common power bus and at least one common data/control bus that are each connected to a plurality of the components.

9. An installation according to claim 1, wherein an active cooling system cools the part of the wall supporting the components.

10. An installation according to claim 9, wherein the cooling system shares components with the cooling system of one or more subsystems of the medical imaging system.

11. An installation according to claim 9, wherein the scanner includes a set of coils and a set of magnets, and the cooling system shares components with a cooling system for cooling the coils and/or the cooling system for the magnets.

12. An installation for a medical imaging system comprising:
 a suite of at least two adjacent rooms, a shielded room and an operator control room;
 a medical imaging scanner; and
 a processing and control system configured so as to control the operation of the scanner;
 wherein the shielded room is sized to contain at least a medical imaging scanner for generating internal images of a patient, and the separating wall separating the shielded room and the operator control room supports components of the processing and control system, wherein substantially all of the components are connected together with a common data/control bus, and a common power bus.

* * * * *